United States Patent
Tseng

(10) Patent No.: US 7,652,938 B2
(45) Date of Patent: *Jan. 26, 2010

(54) METHODS AND SYSTEMS FOR GENERATING LATCH CLOCK USED IN MEMORY READING

(75) Inventor: Jui-Hsing Tseng, Kaohsiung (TW)

(73) Assignee: Mediatek, Inc., Hsin-Chu (TW)

( * ) Notice: Subject to any disclaimer, the term of this patent is extended or adjusted under 35 U.S.C. 154(b) by 211 days.

This patent is subject to a terminal disclaimer.

(21) Appl. No.: 11/551,771

(22) Filed: Oct. 23, 2006

(65) Prior Publication Data

US 2007/0041253 A1    Feb. 22, 2007

Related U.S. Application Data

(63) Continuation-in-part of application No. 11/086,553, filed on Mar. 22, 2005, now Pat. No. 7,142,470.

(51) Int. Cl.
*G11C 7/00* (2006.01)

(52) U.S. Cl. .................. 365/194; 365/191; 365/189.07

(58) Field of Classification Search ................ 365/194, 365/189.07, 191, 230.08, 189.05, 189.08, 365/233, 189.01

See application file for complete search history.

(56) References Cited

U.S. PATENT DOCUMENTS

| | | | | |
|---|---|---|---|---|
| 4,450,538 A * | 5/1984 | Shirasaka | ............... | 365/189.02 |
| 6,011,732 A | 1/2000 | Harrison et al. | | |
| 6,070,260 A * | 5/2000 | Buch et al. | ................... | 714/731 |
| 6,137,734 A | 10/2000 | Schoner et al. | | |
| 6,430,696 B1 | 8/2002 | Keeth | | |
| 6,801,989 B2 | 10/2004 | Johnson et al. | | |
| 6,804,760 B2 * | 10/2004 | Wiliams | ..................... | 711/170 |
| 6,930,524 B2 | 8/2005 | Drexler | | |
| 6,980,480 B2 * | 12/2005 | Choi | ..................... | 365/189.14 |
| 7,130,226 B2 * | 10/2006 | Lee | ............................. | 365/194 |
| 7,142,470 B2 * | 11/2006 | Tseng | ........................ | 365/194 |
| 7,355,922 B2 * | 4/2008 | Johnson et al. | ......... | 365/233.12 |

FOREIGN PATENT DOCUMENTS

| TW | 576022 | 2/2004 |
|---|---|---|
| TW | 594743 | 6/2004 |

OTHER PUBLICATIONS

TW Notice of Allowance mailed Jun. 24, 2008.

* cited by examiner

*Primary Examiner*—Dang T Nguyen
(74) *Attorney, Agent, or Firm*—Thomas, Kayden, Horstemeyer & Risley

(57) ABSTRACT

Methods and systems for generating a latch clock in memory reading. Data with a first logic level and with a second logic level are stored into a first address and a second address of a memory, respectively. A read data signal is generated by issuing continuous read commands for repeated retrieval of the data at the first and the second addresses of the memory. Varying a delay parameter until at least an edge of the internal clock signal and any edge of the read data signal are aligned. Finally, the latch clock is generated according to the delay parameter and the internal clock.

19 Claims, 5 Drawing Sheets

METHODS AND SYSTEMS FOR GENERATING LATCH CLOCK USED IN MEMORY READING

CROSS-REFERENCE TO RELATED APPLICATIONS

This application is a continuation-in-part of U.S. application Ser. No. 11/086,553 filed on Mar. 22, 2005.

BACKGROUND

The disclosure relates in general to memory subsystems. In particular, the disclosure relates to methods and systems for generating a latch clock used in memory reading.

Among many types of random access memory (RAM) architectures, two common types of volatile RAM are dynamic RAM (DRAM) and static RAM (SRAM). Each storage element (or "bit") of SRAM is constructed using a flip-flop, a basic storage device typically requiring approximately six transistors. In contrast, DRAM requires only one transistor per bit and is therefore generally cheaper and more compact than SRAM. SRAM is typically faster than DRAM and much simpler to use. Consequently, SRAM is typically used in computer devices that require fast but small memories, while DRAM is typically used when a large amount of RAM is needed. In fact, many microprocessor-based systems use a combination of DRAM and SRAM, constructing the large main memory from DRAM chips and using SRAM for the smaller memory devices, such as memory caches for the processor. A number of DRAM architectures are available, including synchronous DRAM (SDRAM), extended data output DRAM (EDO DRAM), and Rambus™ DRAM (RDRAM).

Conventional DRAM chips receive a plurality of input signals which define parameters such as the location, or address, of the memory data and which transmit the memory data. A read or write transaction with a DRAM generally involves two steps. First, address and control signals are asserted to the DRAM, allowing the DRAM to prepare for the data transfer. Second, the DRAM reads or writes the data, completing the data transfer. Synchronous DRAM operates similarly to conventional DRAM, although SDRAM signals include a reference clock signal to which the other SDRAM signals are synchronized. SDRAM also typically supports pipelining, which allows the SDRAM to accept address and control signals for a one memory transaction while transacting a previous memory request via the data signals.

An important consideration for selecting a memory device in a microprocessor-based system is the speed at which data can be written to and read from the memory device. Memory speed is also commonly known as "bandwidth", a term which refers to the frequency content of the memory signals. Generally, a higher speed memory device is more efficient, because it can supply data at a faster rate (or "higher bandwidth"). In fact, memory bandwidth is often considered a crucial factor in evaluating the performance of processor-based systems. The emergence of new memory technologies and improvements in existing memory architectures are helping to increase current memory bandwidth, thus improving computer performance.

Memory timing accuracy is very important for memory access. If the timing requirements are not met, the memory device may not function properly, and the memory read and write data may contain errors.

Achieving signal timing accuracy can be very difficult in practice. The natural laws of electromagnetics which govern the transmission of electronic signals tend to introduce various amounts of delay and distortion to high frequency signals. These "electromagnetic" effects are commonly known as capacitive (or inductive) loading, which causes signal delay, and ringing, which causes signal distortion. In addition to the signal bandwidth, the physical location and dimensions of the signal conductors (known as signal "traces") also affect the transmission behavior, as does the level of current used to transmit the signals.

Under capacitive loading, certain signals may travel across the circuit board at a delay with respect to the synchronizing clock signal. It is common to adjust for signal delays by inserting delay buffers, devices which delay electronic signals, into the memory interface. Often, each signal transmitted or received by the memory controller will be delay-buffered. By setting the proper amount of delay for each buffer, the memory signals can be synchronized with the clock signal.

A significant problem with using delay buffers is that the optimum delay can be difficult to predict before the circuit board is manufactured. First, different memory technologies may include different signals or may operate at different speeds. To accommodate a wide variety of memory devices, the delay buffers must be specially configured for each new memory system design. Even if the same type of memory device is used in a different computer system, however, differences in signal traces on the circuit board can change the required delay settings considerably.

Another problem is that, due to the inherent limitations of present integrated chip and circuit board technology, the capacitive loading can fluctuate slightly from board to board during manufacturing. Thus, even a carefully designed circuit board may not meet memory signal timing requirements due to manufacturing imperfections.

U.S. Pat. No. 6,137,734 discloses an automatic configuration of delay parameters in a dynamic memory controller. It automatically searches various combinations of transmit and receive delay pairs to determine whether successful memory read and write operations are achieved if the memory controller is configured according to each particular delay pair. The resulting collection of tested delay pairs, having either successful or failed results, may be arranged according to the delay values to form what is known in the art as a "shmoo" plot. These delay pairs, although a memory controller configured according to them will communicate successfully with its SDRAM, are close enough to failing delay values that small changes in operating conditions may cause a memory controller choosing such an operating point to fail to synchronize with its SDRAM device. U.S. Pat. No. 6,137,734 discloses an algorithm to select an optimal delay pair. This algorithm, however, may still choose operating points close to the edge of the shmoo plot.

SUMMARY

Methods and systems for generating a latch clock used in reading a memory are provided. An embodiment of a method for generating from an internal clock a latch clock used in reading a memory, comprising: storing data with a first logic level into a first address of the memory and data with a second logic level into a second address of the memory, generating a read data signal by issuing continuous read commands for repeated retrieval of the data at the first and the second addresses of the memory, varying a delay parameter until at least an edge of the internal clock signal and any edge of the read data signal are aligned, and generating the latch clock according to the delay parameter and the internal clock.

An embodiment of a memory subsystem comprises a memory and a memory controller comprising an internal clock. In a calibration mode, the memory controller stores data with a first logic level into a first address of the memory, stores data with a second logic level into a second address of the memory, generates a read data signal by issuing continuous read commands for repeated retrieval of the data at the first and the second addresses of the memory, adjusts a delay parameter until any edge of the read data signal and at least one edge of the internal clock signal are aligned, and generates a latch clock according to the delay parameter and the internal clock.

Another embodiment of a memory subsystem is disclosed comprising a memory and a memory controller. The memory controller is operative to provide a latch clock and access the memory with reference to the latch clock, which comprises means for storing data with a first logic level into a first address of the memory, and storing data with a second logic level into a second address of the memory, means for generating a read data signal by issuing continuous read commands to repeatedly retrieve the data at the first and the second addresses of the memory, means for varying a delay parameter until any edge of the read data signal and at least one edge of the internal clock signal are aligned, and means for generating the latch clock according to the delay parameter and the internal clock.

BRIEF DESCRIPTION OF THE DRAWINGS

The invention will become more fully understood from the detailed description, given hereinbelow, and the accompanying drawings. The drawings and description are provided for purposes of illustration only and, thus, are not intended to be limiting of the present invention.

DETAILED DESCRIPTION

Figure 1:
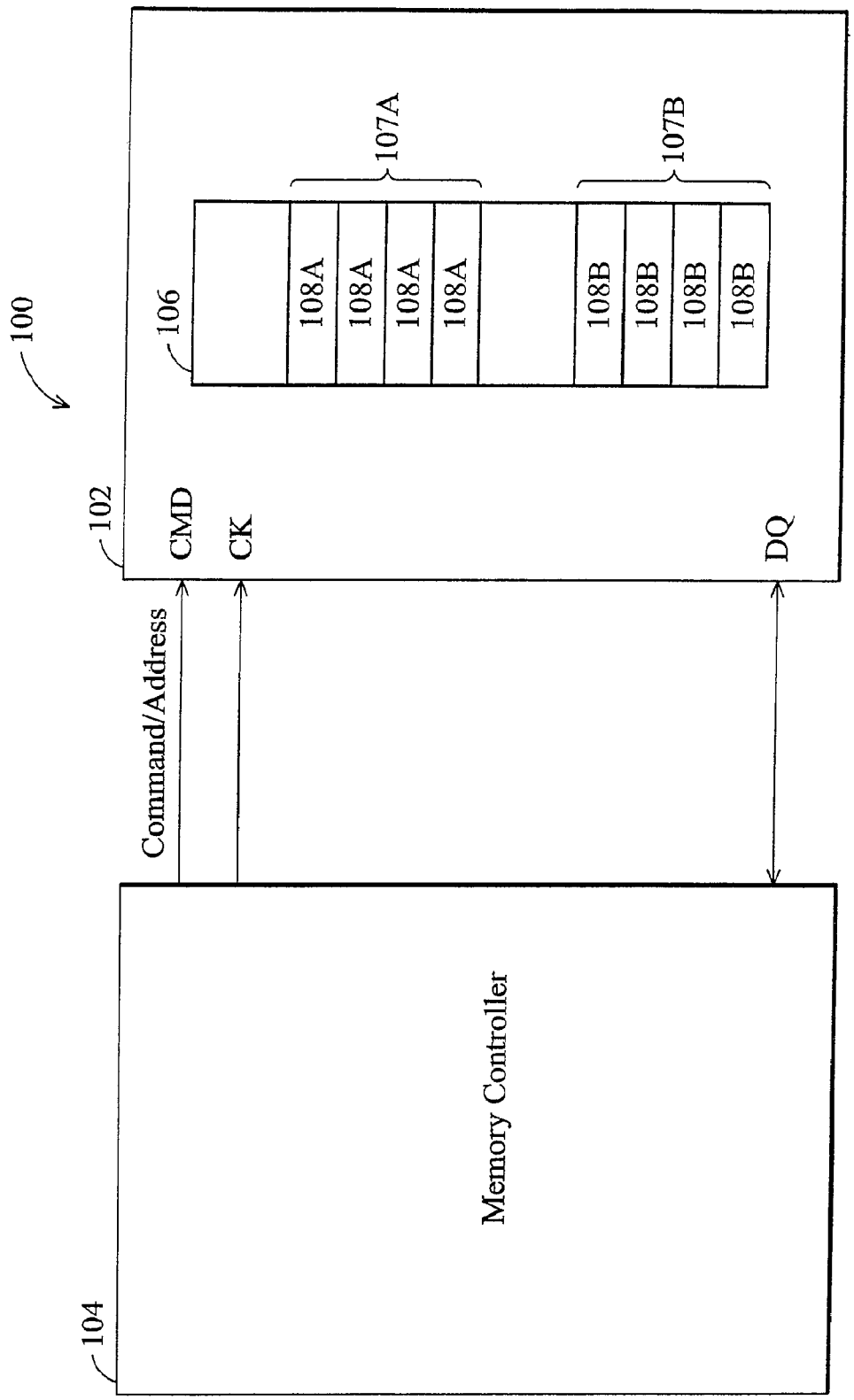
FIG. 1 is a simplified functional diagram of a memory subsystem including a memory and a memory controller.

FIG. 1 is a simplified functional diagram of a memory subsystem 100 comprising a memory controller 104 and a memory 102. Memory 102 comprises a memory array 106 typically arranged in a plurality of banks, with two such banks 107A and 107B shown in FIG. 1. The memory array 106 includes a plurality of individual memory elements (not shown) storing data, with the memory elements typically arranged in separately addressable rows and columns. Those skilled in the art often refer to a collectively addressable subset of the array 102 as a "page". Typically, a single row of memory elements in a bank of the array constitutes a particular page. In FIG. 1, a plurality of pages (identified by reference numerals 108A and 108B) are depicted, corresponding with banks 107A and 107B, respectively.

As known to those skilled in the art, particular locations within the memory array 106 are addressable by Address signals provided by memory controller 104. Memory controller 104 also provides a plurality of control or command signals to designate the particular memory access type and/or sequence of memory accesses. Terminal CMD of memory 102 receives signals Command/Address, and terminal CK of memory 102 receives internal clock CK from memory controller 104. Data written to and read from the memory 102 is transferred from and to memory controller 104 via terminal DQ of memory 102.

Figure 2:
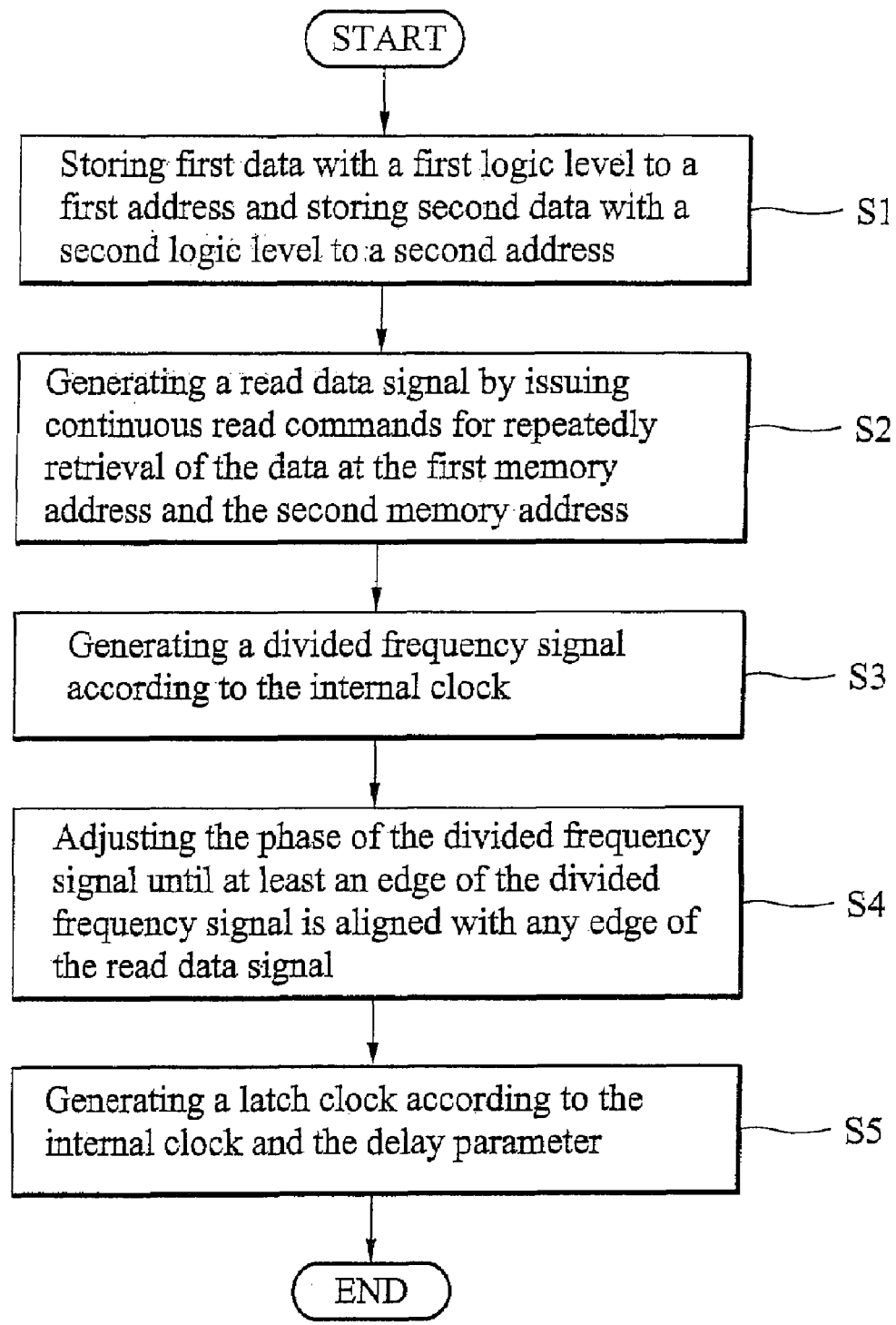
FIG. 2 is a flowchart of an embodiment of a method for generating a latch clock for reading a memory in calibration mode.

FIG. 2 is a flowchart of an embodiment of a method for generating a latch clock for reading a memory in calibration mode. First, memory controller 104 stores data "1" with a first logic level (high logic level as an example) to a first address and data "0" with a second logic level (low logic level as an example) to a second address (S1). Note that data stored at the first and the second addresses must be complementary, and can be continuously accessed without closing or opening the page. In other words, the first address and the second address may represent locations in the same page or are continuously addressed.

Next, memory controller 104 issues continuous read commands for repeated retrieval of the data from the first and the second memory addresses (S2) in sequence. Thus, a read data signal RD featuring a clock waveform is output from terminal DQ of memory 102. As a result, the frequency of the read data signal RD is half that of the internal clock CK. Note that the frequency of the internal clock CK can be a multiple of the frequency of the read data signal RD depending on the data stored in the memory 102 and the read sequence.

Next, the frequency of clock CK is divided by a given divide ratio, resulting in a divided frequency signal CKD having a frequency equal to the frequency of the read data signal RD (S3). In some embodiments, the frequency of signal CKD may be equal to integral times of that of signal RD. In some embodiments, a given divide ratio is equal to one. While a given divide ratio is equal to one, the step of generating dividing frequency can be ignored.

Still referring to FIG. 2, the method proceeds to adjust the phase of the divided frequency signal CKD until at least one edge of the divided frequency signal is aligned with an edge of the read data signal RD (S4). In some embodiments, the phase of the divided frequency signal CKD is adjusted by delaying the divided frequency signal CKD as a result of varying a delay parameter. The phase shifted divided frequency signal is labeled $CKD_{(SHIFT)}1$ or $CKD_{(SHIFT)}2$ in FIGS. 3 through 5. Note that the phase alignment may be the rising edges of phase shifted signal $CKD_{(SHIFT)}1$ aligned with the rising edges of the read data signal RD, or the falling edges of phase shifted signal $CKD_{(SHIFT)}2$ aligned with the rising edges of the read data signal RD. In some embodiments, aligning any edge of read data signal and at least one edge of the internal clock signal can be achieved by varying delay parameter to adjust the read data signal. Alternatively, the read data can be directly adjusted to align with internal clock.

After obtaining the delay parameter used in adjusting the phase of signal CKD, the latch clock RL is generated according to the internal clock CK and the delay parameter (S5), completing the calibration mode. In some embodiments, the latch clock RL is generated from an inverse version of the internal clock CK delayed by the delay element using the delay parameter. Alternatively, the latch clock RL can be generated from the internal clock CK delayed by the delay element using the delay parameter. In addition, as the divided frequency signal CKD is shifted by a predetermined amount of phase, the latch clock RL is set depending on a mean value of the predetermined amount of phase and the internal clock.

Thus, in normal mode, data stored in the memory 102 is read by memory controller 104 using the latch clock RL. As the data is captured by the rising edges of the latch clock RL, the latch clock RL is generated from an inverse version of the internal clock CK delayed by the delay element using the delay parameter. As the data is captured by the falling edges of the latch clock RL, the latch clock RL is generated from the internal clock CK delayed by the delay element using the delay parameter.

Figure 3:
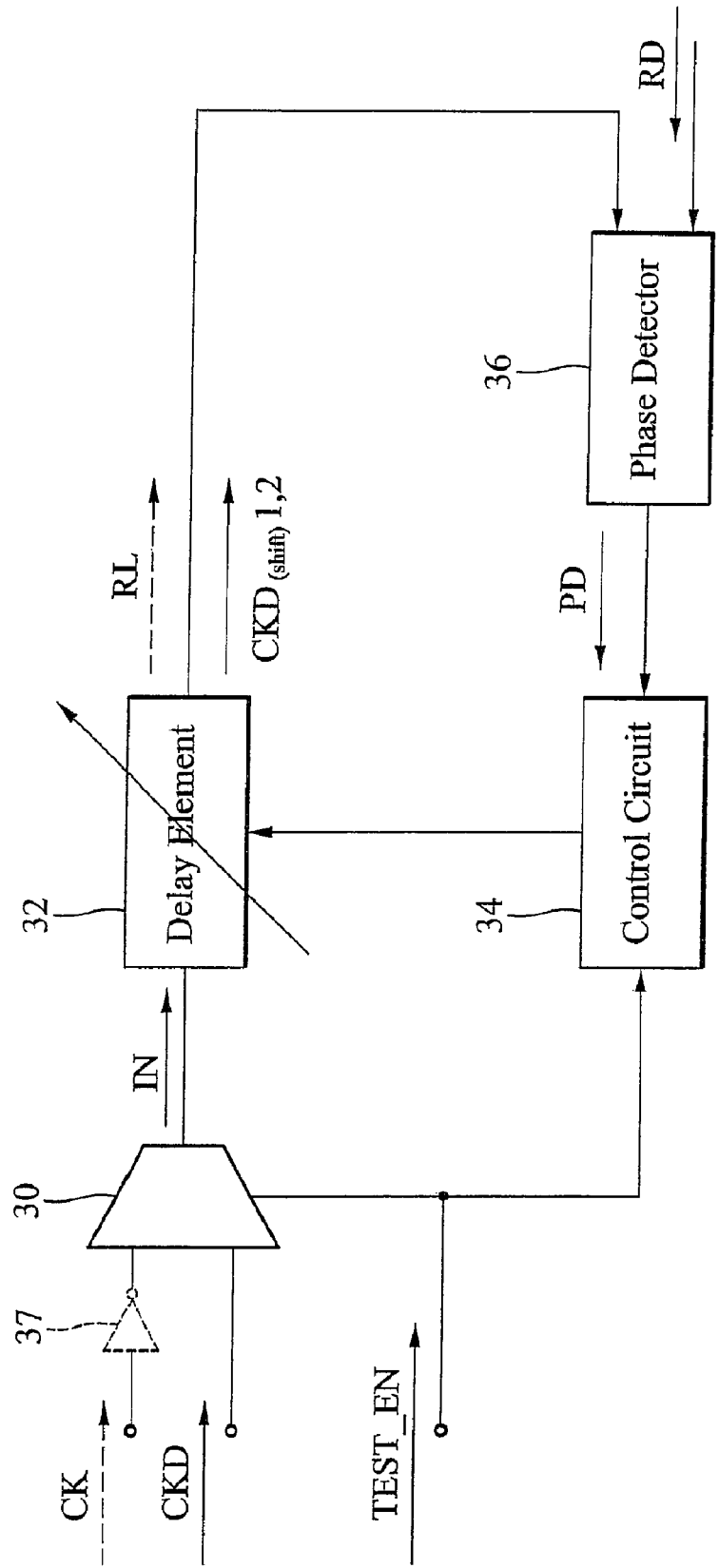
FIG. 3 is a block diagram of an embodiment of a memory controller capable of calibrating a latch clock.

FIG. 3 is a block diagram of an embodiment of a memory controller capable of calibrating the internal clock. In calibration mode, signal TEST_EN is asserted. Multiplexer 30 passes divided frequency signal CKD to delay element 32 as input. The delay parameter of delay element 32 is adjustable to shift the phase of signal IN. Phase shifted signals $CKD_{(SHIFT)}1$ (or $CKD_{(SHIFT)}2$) output from delay element 32 are sent to phase detector 36. Phase detector 36 detects the edges of phase shifted signal $CKD_{(SHIFT)}1$ (or $CKD_{(SHIFT)}2$) and read data signal RD. When at least an edge of phase shifted signals $CKD_{(SHIFT)}1$ (or $CKD_{(SHIFT)}2$) is aligned with any edge of the read data signal RD, a phase determined signal PD is asserted by the phase detector 36. Phase determined signal PD is provided to control circuit 34. When signal PD is in deassertion state, control circuit 34 adjusts the delay parameter of delay element 32 to shift the phase of signal IN. Upon assertion of signal PD, signal TEST_EN is deasserted to disable control circuit 34, and multiplexer 30 diverts internal clock CK to delay element 32. Delay element 32 shifts the phase of internal clock CK using the just adjusted delay parameter to generate latch clock RL. As a result, signal RL for memory read is internal clock CK subjected to sufficient calibration. Optionally, inverter 37 can be added to generate an inverse version of internal clock CK if required.

Figure 4:
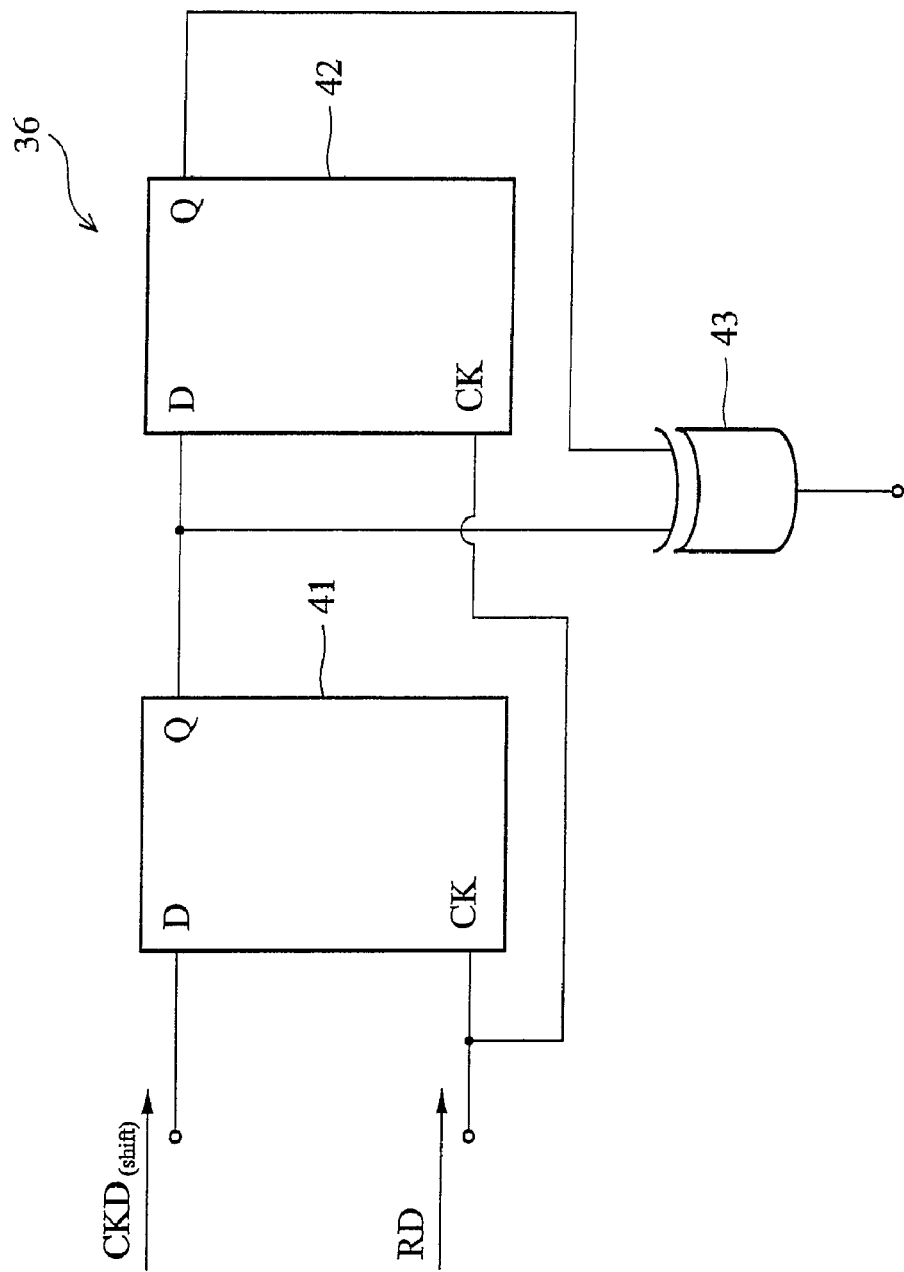
FIG. 4 is a circuit diagram of an embodiment of a phase detector.

FIG. 4 is a circuit diagram of an embodiment of the phase detector. Phase detector 36 comprises flip-flops 41 and 42 and an XOR logic gate 43. Phase shifted signal $CKD_{(SHIFT)}$ is applied to terminal D of flip-flop 41, the output terminal Q of flip-flop 41 is connected to the input terminal D of flip-flop 42, and read data signal RD is applied to terminals CK of both flip-flops 41 and 42 for latching phase shifted signal $CKD_{(SHIFT)}$. In the example of FIG. 4, data on the D input of each flip-flop is "latched" and transferred to the Q output when read data signal RD is at a high logic level. In the course of signal RD at a low logic level, the Q outputs of flip-flops 41 and 42 retain their values until signal RD goes high again. In other embodiments, read data signal RD can be fed to terminal D of flip-flop 41 and latched by phase shifted signal $CKD_{(SHIFT)}$ applied to terminal CK of flip-flop 41. With reference to FIG. 3, phase determined signal PD occurs on the output of XOR gate 43. Phase determined signal PD can be asserted by XOR gate 43 when the Q outputs of flip-flops 41 and 42 are at different logic levels, meaning that the two signals $CKD_{(SHIFT)}$ and RD have been deemed phase alignment.

Figure 5:
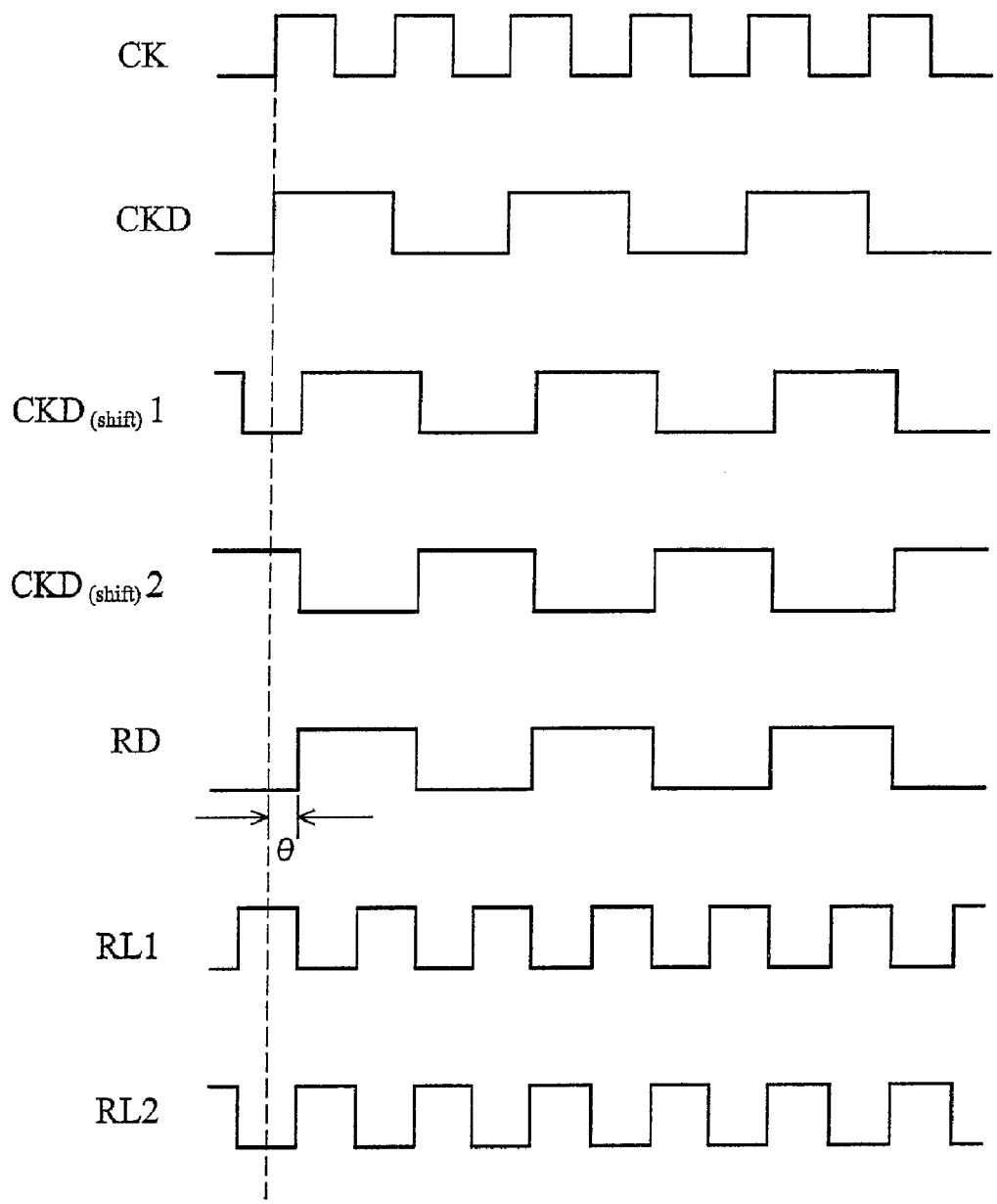
FIG. 5 is a timing chart showing waveforms of signals according to the exemplary embodiment.

FIG. 5 is a timing chart showing waveforms of separate signals according to the exemplary embodiment. In FIG. 5, the frequency of the read data signal RD and the frequency of divided frequency signal CKD are half that of the internal clock CK. There is a phase difference θ between rising edges of internal clock CK and read data signal RD. The waveform of the divided frequency signal CKD delayed by θ is $CKD_{(SHIFT)}1$, and delayed by (θ+180□) is $CKD_{(SHIFT)}2$, their edges being aligned with those of read data signal RD. Latch clocks RL1 and RL2 are respectively generated from an inverse version of the internal clock CK delayed by θ, and from the internal clock CK delayed by θ.

In FIG. 5, as data is strobed out of the memory using the rising edges of the latch clock, latch clock RL1 captures the read data at proper timing, about the middle point of the read data. As data is strobed out of the memory using the falling edges of the latch clock, latch clock RL2 captures the read data accurately.

The foregoing description of several embodiments have been presented for the purpose of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for generating, from an internal clock, a latch clock used in reading a memory, the method comprising:

storing data with a first logic level into a first address of the memory and data with a second logic level into a second address of the memory;

generating a read data signal by issuing continuous read commands for repeated retrieval of the data at the first and the second addresses of the memory;

varying a delay parameter until at least an edge of the internal clock signal and any edge of the read data signal are aligned; and generating the latch clock according to the delay parameter and the internal clock.

2. The method as claimed in claim 1, further comprising reading data stored in the memory with reference to the latch clock.

3. The method as claimed in claim 1, wherein the first memory address and the second memory address are within a page of the memory.

4. The method as claimed in claim 1, wherein the first memory address and the second memory address are contiguous.

5. The method as claimed in claim 1, wherein the frequency of the internal clock is integral times of a frequency of the read data signal.

6. A memory subsystem, comprising:

a memory; and a memory controller comprising an internal clock, the memory controller operative in a calibration mode to store data with a first logic level into a first address of the memory, to store data with a second logic level into a second address of the memory, to generate a read data signal by issuing continuous read commands for repeated retrieval of the data at the first and the second addresses of the memory, to adjust a delay parameter until any edge of the read data signal and at least one edge of the internal clock signal are aligned, and to generate a latch clock according to the delay parameter and the internal clock.

7. The memory subsystem as claimed in claim 6, wherein the memory controller reads data stored in the memory with reference to the latch clock in a normal mode.

8. The memory subsystem as claimed in claim 6, wherein the memory comprises a page, and the first and the second addresses are within the page.

9. The memory subsystem as claimed in claim 6, wherein the first memory address and the second memory address are contiguous.

10. The memory subsystem as claimed in claim 6, wherein the frequency of the internal clock is integral times of a frequency of the read data signal.

11. The memory subsystem as claimed in claim 6, wherein the memory controller comprises:
   a phase detector operative to receive the read data signal, and to output a phase determined signal in assertion state when at least an edge of the read data signal is aligned with at least one edge of the internal clock; and
   a control circuit operative to change the delay parameter when the phase determined signal is in deassertion state.

12. A memory subsystem, comprising:
   a memory; and
   a memory controller providing a latch clock and accessing the memory with reference to the latch clock, comprising:
      means for storing data with a first logic level into a first address of the memory, and storing data with a second logic level into a second address of the memory;
      means for generating a read data signal by issuing continuous read commands to repeatedly retrieve the data at the first and the second addresses of the memory;
      means for varying a delay parameter until any edge of the read data signal and at least one edge of the internal clock signal are aligned; and
      means for generating the latch clock according to the delay parameter and the internal clock.

13. The method as claimed in claim 1, wherein the data stored into the first address of the memory is data "1" and the data stored into the second address of the memory is data "0".

14. The memory subsystem as claimed in claim 6, wherein the data stored into the first address of the memory is data "1" and the data stored into the second address of the memory is data "0".

15. The memory subsystem as claimed in claim 12, wherein the data stored into the first address of the memory is data "1" and the data stored into the second address of the memory is data "0".

16. The method as claimed in claim 1, wherein the data respectively stored in the first address and the second address are complementary.

17. The memory subsystem as claimed in claim 6, wherein the data respectively stored in the first address and the second address are complementary.

18. The method as claimed in claim 1, wherein the data respectively stored in the first address and the second address are continuously accessed without closing or opening the page.

19. The memory subsystem as claimed in claim 6, wherein the data respectively stored in the first address and the second address are continuously accessed without closing or opening the page.

* * * * *